United States Patent [19]

Kondo et al.

[11] Patent Number: 5,055,789
[45] Date of Patent: Oct. 8, 1991

[54] MAGNETIC RESONANCE IMAGING SYSTEM

[75] Inventors: Masafumi Kondo; Kozo Satoh, both of Yokohama, Japan

[73] Assignee: Kabushiki Kaisha Toshiba, Kawasaki, Japan

[21] Appl. No.: 480,767

[22] Filed: Feb. 16, 1990

[30] Foreign Application Priority Data

Feb. 17, 1989 [JP] Japan .................................. 1-37640

[51] Int. Cl.[5] .......................................... G01R 33/20
[52] U.S. Cl. .................................................. 324/309
[58] Field of Search ................ 324/307, 309, 311, 312

[56] References Cited

U.S. PATENT DOCUMENTS

| 4,733,188 | 3/1988 | Sekihara et al. | 324/312 |
| 4,818,942 | 4/1989 | Rzedzian | 324/309 |
| 4,949,042 | 8/1990 | Kuhara et al. | 324/311 |

FOREIGN PATENT DOCUMENTS

| 0300283 | 1/1989 | European Pat. Off. |
| 3802081 | 8/1988 | Fed. Rep. of Germany |
| WO8505693 | 12/1985 | PCT Int'l Appl. |

OTHER PUBLICATIONS

Sekihara et al., Image Restoration from Nonuniform Static Field Influence in Modified Echo-Planar Imaging, Med. Phys., vol. 14, No. 6, 1987, pp. 1087–1089.
Sekihara et al., New Reconstruction Technique for Echo-Planar Imaging to Allow Combined Use of Odd and Even . . . , Magnetic Resonance in Med., No. 5, 1987.
Guilfoyle et al., Chemical-Shift Imaging, Magnetic Resonance in Medicine, No. 2, 1985, pp. 479–489.

*Primary Examiner*—Michael J. Tokar
*Attorney, Agent, or Firm*—Oblon, Spivak, McClelland, Maier & Neustadt

[57] ABSTRACT

An MRI system applies a phase encoding gradient field, a read-out gradient field, and an RF field to an object which is placed in a homogeneous static field in accordance with a predetermined pulse sequence so as to excite MR at a specific slice plane of the object, thereby detecting an MR signal from the object and visualizing the slice plane. The system includes a data acquiring section for acquiring all the data required for image reconstruction of the slice portion excited by the RF field within a time in which magnetization in the slice plane is relaxed, by switching the read-out gradient field to positive and negative polarities, an image reconstructing section for obtaining positive and negative time phase images which are respectively based on data acquired when the read gradient field is at positive time phases and data acquired when the read gradient field is at negative time phases by performing image reconstruction based on the respective data, a correcting section for correcting an image degradation factor for each time phase images, and an image synthesizing section for obtaining an MR image of the slice portion by synthesizing both time phase images corrected by the correcting section.

8 Claims, 7 Drawing Sheets

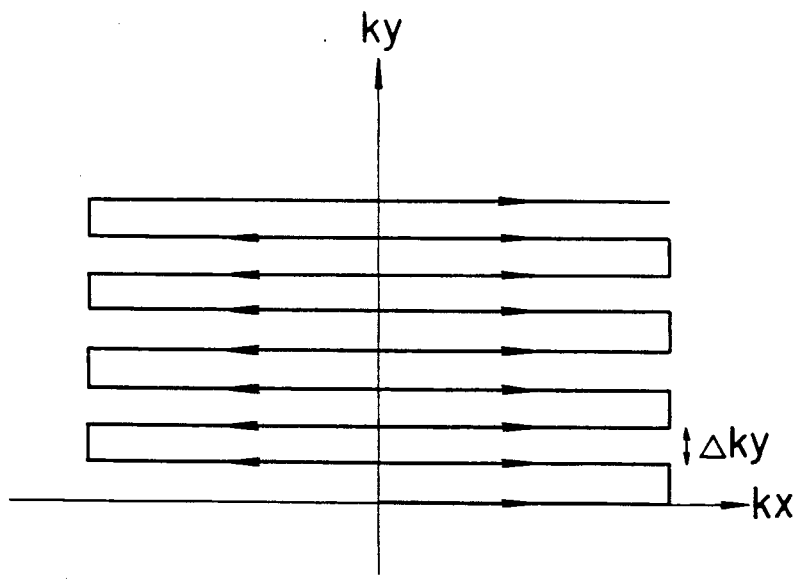
FIG. 5
PRIOR ART
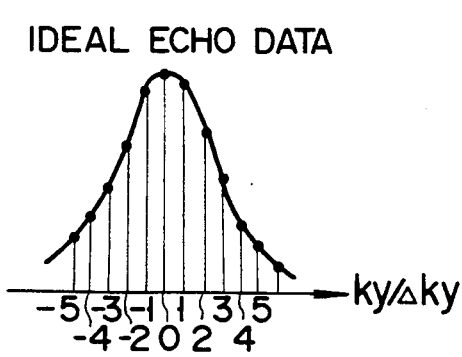
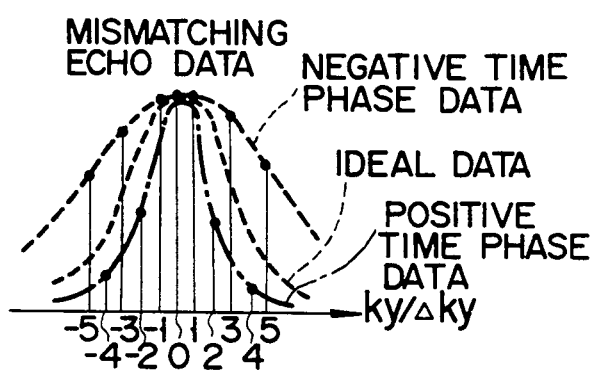
FIG. 6A  FIG. 6B

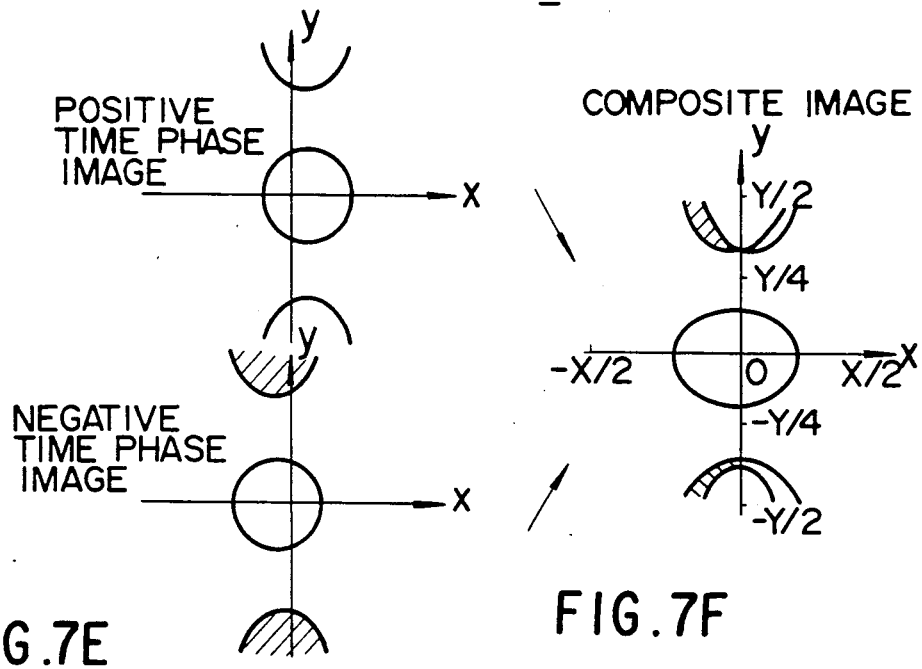
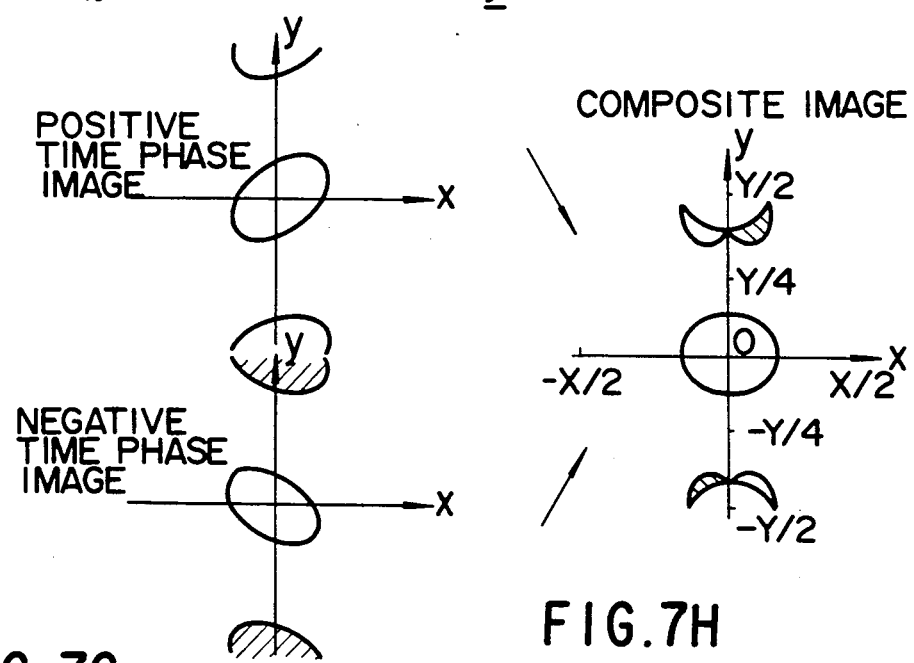

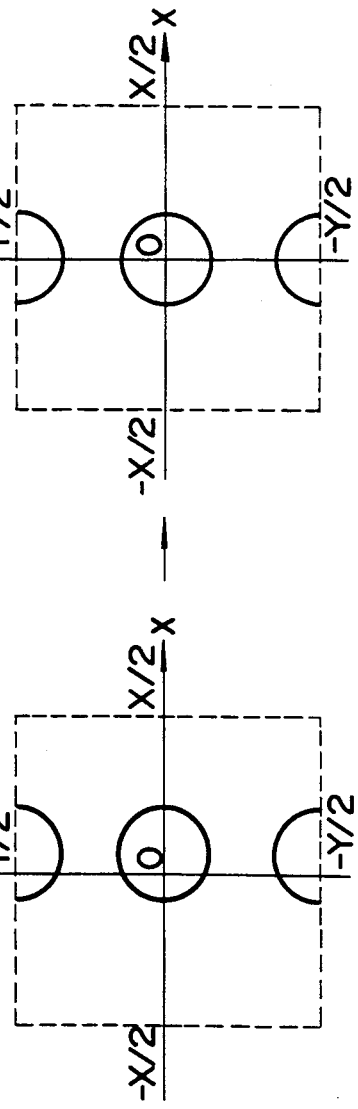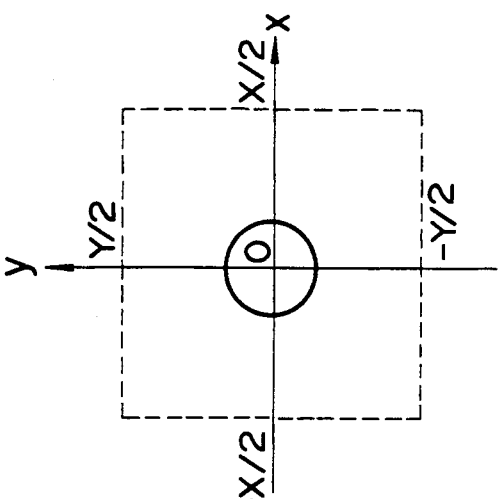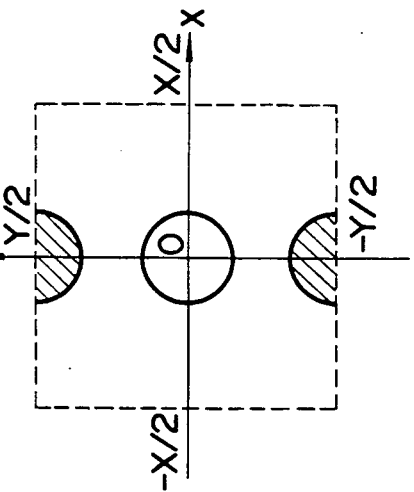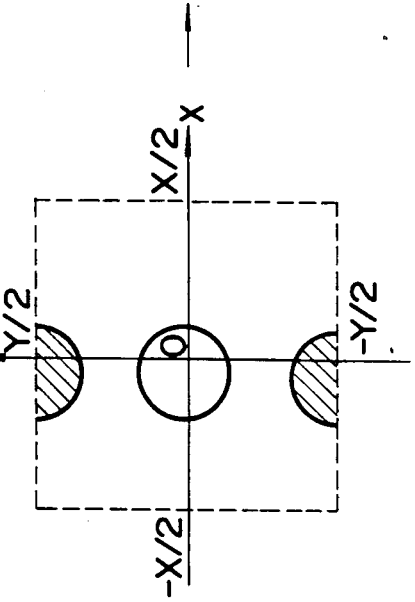

MAGNETIC RESONANCE IMAGING SYSTEM

BACKGROUND OF THE INVENTION

1. Field of the Invention

The present invention relates to a magnetic resonance imaging (MRI) system and, more particularly, to an MRI system for acquiring spin density image data in an object to be examined at high speed.

2. Description of the Related Art

As is well known, magnetic resonance imaging (MRI) is a technique of visualizing microscopic chemical/physical data of a substance by utilizing a phenomenon in which when atomic nuclei having specific magnetic moments are placed in a uniform static field, they resonantly absorb energy of a magnetic field which is rotated at a specific frequency, i.e., an RF magnetic field.

In an MRI system for obtaining an image by this MRI technique, a very long data acquisition time is required as compared with other medical imaging system such as an ultrasound imaging system and an X-ray computed tomography (CT) system. Thus, artifacts may appear or blurring may occur due to the movement of an object arising from respiration and the like. Therefore, moving portions, i.e., a cardiovascular systems are difficult to be imaged. In addition, scanning (imaging) takes a long data acquisition time, a patient inevitably experiences discomfort.

Therefore, as high-speed imaging methods of obtaining an MR image at high speed, the echo planar imaging method by Mansfield, the ultra high speed method by Hutchison et al., and the like have been proposed.

FIGS. 1A–1D show pulse sequences for image data acquisition by the echo planar imaging method.

(1) While a slicing gradient field Gs is applied as seen in FIG. 1B, a 90° selective excitation RF pulse, as seen in FIG. 1A, is applied as an RF magnetic field RF so as to selectively excite magnetization at a slice plane.

(2) A 180° RF pulse is applied as seen in FIG. 1A.

(3) A phase encoding gradient field Ge, as seen in FIG. 1D, is statically applied in a direction parallel to a slice plane. At the same time, a read-out gradient field Gr, as seen in FIG. 1C, is applied in a direction perpendicular to the gradient fields Gs and Ge in such a manner that the gradient field Gr is repeatedly switched to the positive and negative polarities at high speed.

FIGS. 2A–2D show pulse sequences of the ultra high speed Fourier method (also called the multiple echo Fourier method). This method is different from the echo planar imaging method in that a phase encoding gradient field Ge, as seen in FIG. 2D, is applied in the form of a pulse every time switching of a read gradient field Gr, as seen in FIG. 2C, is performed.

By using these pulse sequences, since there is a timing when phases of magnetization in a slice plane are matched with each other upon every switching of a read gradient field, magnetic resonance (MR) multiple echo trains are observed. These echo trains can be acquired as MR data required for imaging of the slice plane within a period of time in which magnetization in the slice plane which is excited by a 90° pulse is relaxed due to a transverse magnetization relaxation phenomenon, and hence high-speed imaging can be performed.

However, these conventional ultra high speed imaging methods have the following problems.

In order to acquire MR data required for image reconstruction at high speed and at high efficiency, the read-out gradient Gr is switched to the positive and negative phases at high speed. Mismatching may be caused between data acquired at positive and negative time phases of the gradient field Gr by various factors, e.g., a static field inhomogeneity, a static field offset, a water/fat mixture system, detection frequency deviation, inclined data sampling in a Fourier space of a density distribution, spatial nonlinearity of gradient fields, and temporal variation of gradient fields. If such mismatching is caused, a conspicuous artifact appears on an image. This leads to a serious problem especially when a static field inhomogeneity is increased and the above-described pulse sequences are applied to a living body in which water and fat are both contained.

In addition, in the above-described echo planar method and ultra high speed Fourier method, since the strength of the phase encoding gradient Ge is very low, a phase encoding error tends to occur due to a static field inhomogeneity. Such a phase encoding error causes positional errors, changes in density data, and blurring in a reconstructed MR image.

SUMMARY OF THE INVENTION

As described above, in the conventional high-speed imaging techniques, mismatching is caused between the data, which are respectively acquired when the gradient field Gr is at positive time phases and at negative time phases, by various factors, e.g., a static field inhomogeneity, a static field offset, a water/fat mixture system, detection frequency deviation, inclined data sampling in a Fourier space of a density distribution, spatial nonlinearity of gradient fields, and temporal variations of gradient fields. Therefore, a conspicuous artifact appears on an MR image obtained by reconstruction. In addition, a static field inhomogeneity and the like causes a phase encoding error. This causes positional errors, changes in density, and blurring in a reconstructed image.

It is an object of the present invention to provide an MRI system which can solve these problems and which can obtain an excellent reconstructed image regardless of the above-described factors such as a static field inhomogeneity, a static field offset, a water/fat mixture system, detection frequency deviation, inclined data sampling a Fourier space of a density distribution, spatial nonlinearity of gradient fields, and temporal variation of gradient fields.

An MRI system according to the present invention comprises a data acquiring section for acquiring all the data required for image reconstruction of a slice plane excited by an RF field within a time in which magnetization in the slice plane is relaxed due to a transverse magnetization relaxation phenomenon by switching a read gradient field to positive and negative phases, an image reconstructing section for performing image reconstruction based on data acquired when the read gradient field is at positive time phases and data acquired when the read gradient field is at negative time phases, a correcting section for correcting an image degradation factor for each time phase images reconstructed by the image reconstructing section, and an image synthesizing section for obtaining an MR image of the slice portion by synthesizing both time phase images after correction. This arrangement enables high-speed imaging with which an excellent MR image can be obtained even if mismatching occurs between data acquired respectively when a gradient field is at positive and negative time phases due to a static field inhomogeneity or the like.

In the system of the present invention, an excellent reconstructed image without artifacts can be obtained regardless of a static field inhomogeneity, a static field offset, a water/fat mixture system, detection frequency deviation, inclined data sampling in a Fourier space of a density distribution, spatial nonlinearity of gradient fields, and temporal variation of gradient fields.

In addition, in high-speed imaging, if a phase encoding gradient field with low strength is used, a phase encoding error may be caused due to a static field inhomogeneity, and errors such as distortion and density changes may be caused in a reconstructed image. However, such errors can be effectively corrected by the present invention.

As described above, according to the system of the present invention, in the high-speed imaging method of acquiring image reconstruction data within a very short time by switching a read gradient field to the positive and negative phases at high speed, even if mismatching occurs between data acquired respectively in the positive and negative time phases of the read gradient field due to the influences of a static field inhomogeneity, a static field offset, a water/fat mixture system, detection frequency deviation, inclined data sampling in a Fourier space of a density distribution, spatial nonlinearity of gradient fields, and temporal variation of gradient fields, an excellent reconstructed image without artifacts can be obtained. Therefore, in the system of the present invention, high-quality image reconstruction without artifacts can be performed by high-speed imaging. This enables visualization of moving portions, such as a heart, a blood vessel system, or a abdomen system, at which considerable a static field inhomogeneity is present.

BRIEF DESCRIPTION OF THE DRAWINGS

FIG. 5 is a view for explaining a data acquisition scheme of the ultra high speed Fourier method in a Fourier space;

FIGS. 6A and 6B are graphs each showing acquired data at the positive and negative time phases of a read gradient field;

FIGS. 7A to 7H are views showing a reconstructed image when positive and negative time phase images are not corrected; and FIGS. 8A-8E are views showing a reconstructed image when positive and negative time phase images are corrected.

DETAILED DESCRIPTION OF THE PREFERRED EMBODIMENTS

Figure 1A:
FIGS. 1A-1D and 2A-2D are timing charts respectively showing pulse sequences of the conventional echo planar method and ultra high speed Fourier method.
Figure 1B:
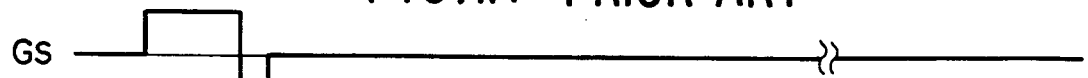
Figure 1C:
Figure 1D:
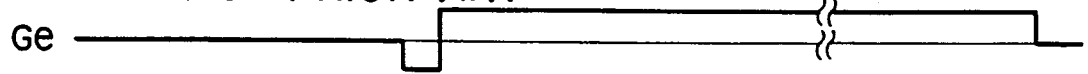
Figure 2A:
Figure 2B:
Figure 2C:
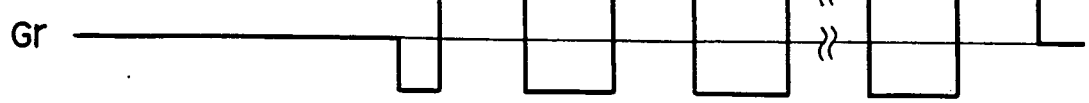
Figure 2D:
Figure 3:
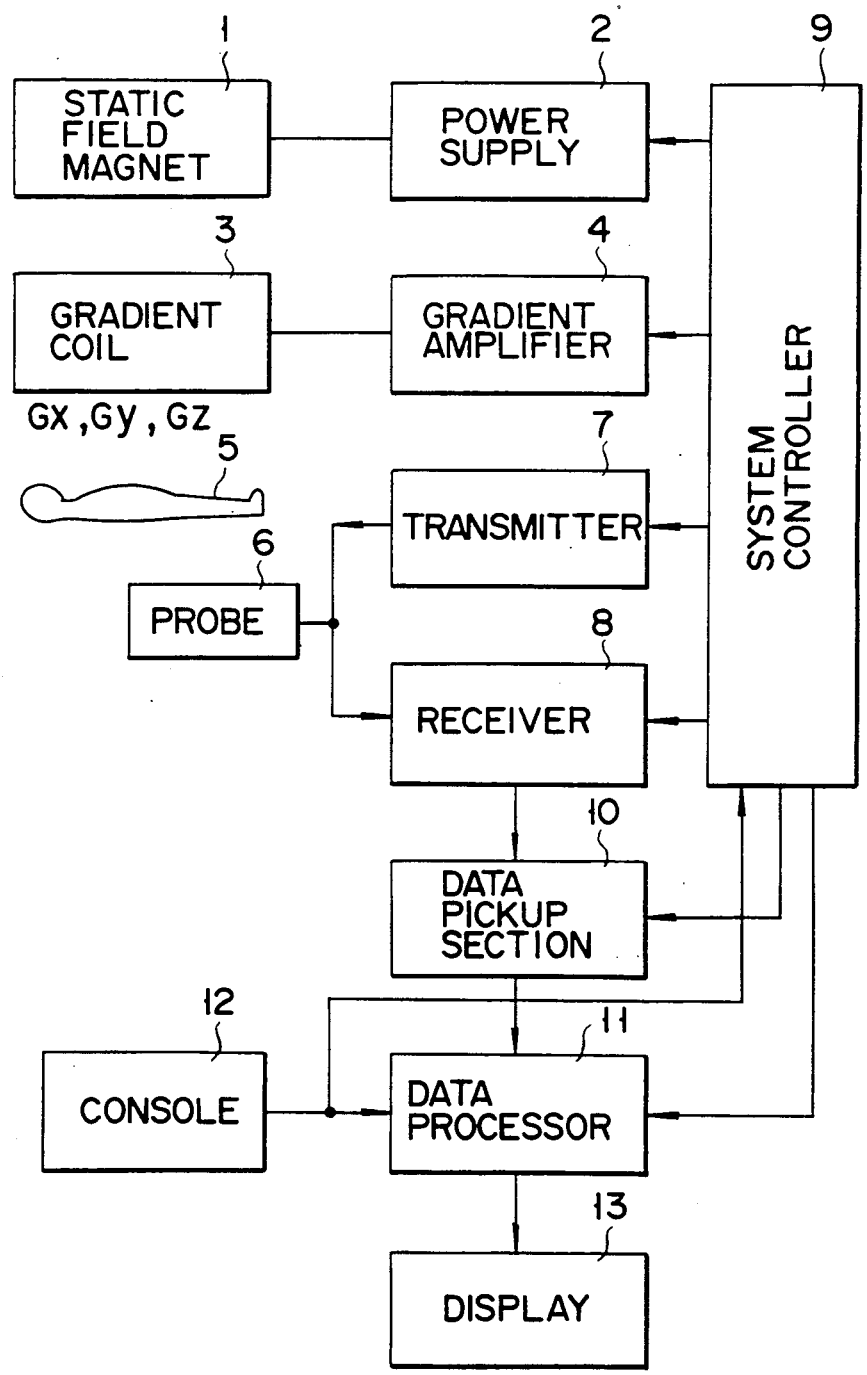
FIG. 3 is a block diagram showing an arrangement of an MRI system according to an embodiment of the present invention.

FIG. 3 is a block diagram showing an arrangement of an MRI system according to an embodiment of the present invention. Referring to FIG. 3, a static field magnet 1 and a gradient coil 3 are respectively driven by a power supply 2 and a gradient amplifier 4. By using the static field magnet 1 and the gradient coil 3, a homogeneous static field and three types of gradient fields Gx, Gy, and Gz respectively having linear gradient field distributions in the same direction as that of the static field and in three orthogonal x, y, and z directions are applied to an object 5 to be examined. An RF signal is transmitted from a transmitter 7 to a probe 6. An RF field is then applied to the object 5 by the probe 6. The probe 6 may be constituted by a single probe unit for signal transmission and reception or by separate units for signal transferred and reception. An MR signal received by the probe 6 is detected by a receiver 8 and is subsequently transferred to a data pickup section 10 so as to be A/D (analog-digital)converted. The A/D converted signal is transferred to a data processor 11. All of the power supply 2, the gradient amplifier 4, the transmitter 7, the receiver 8, and the data pickup section 10 are controlled by a system controller 9. The system controller 9 and the data processor 11 are operated in accordance with data from a console 12 which is operated by an operator. In the data processor 11, Fourier transform of the MR signal and correction of image degrading factors are performed, and a density distribution of desired specific atomic nuclei in the object 5 is calculated. The obtained image is displayed on a display 13.

Figure 4:
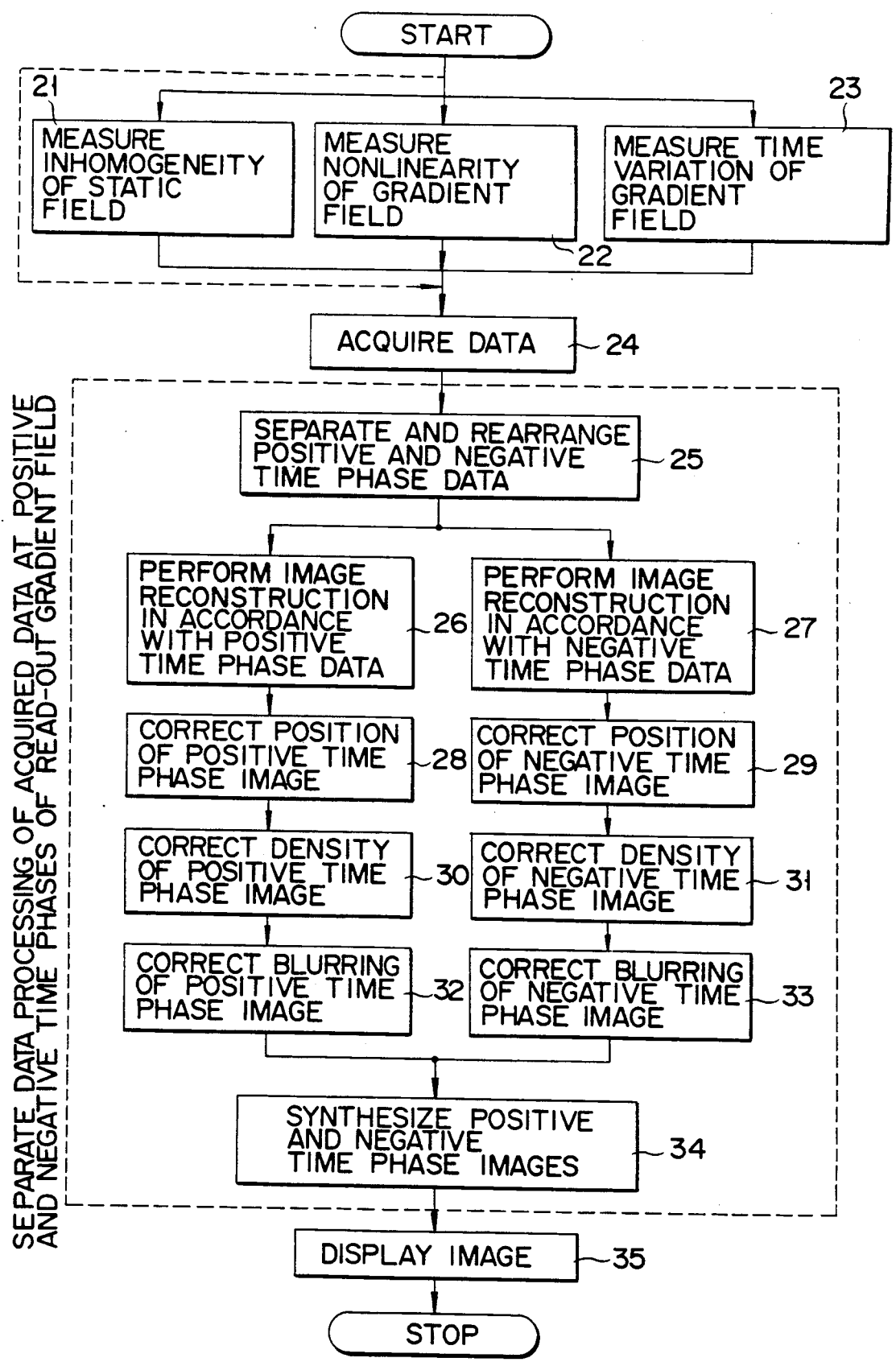
FIG. 4 is a flow chart showing the flow of data processing of the embodiment in FIG. 3.
Figures 7A, 7B:
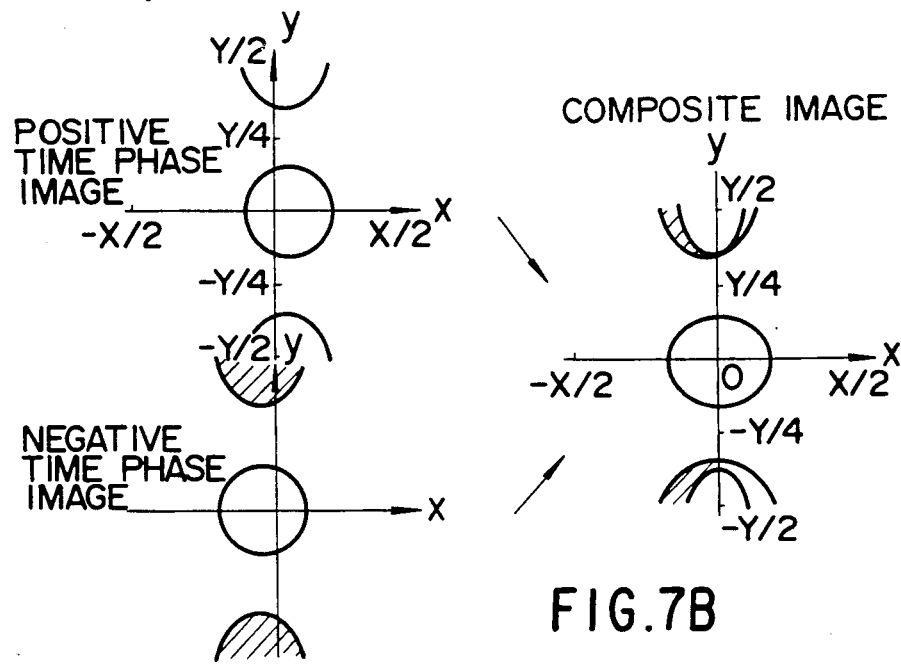
Figures 7C, 7D:
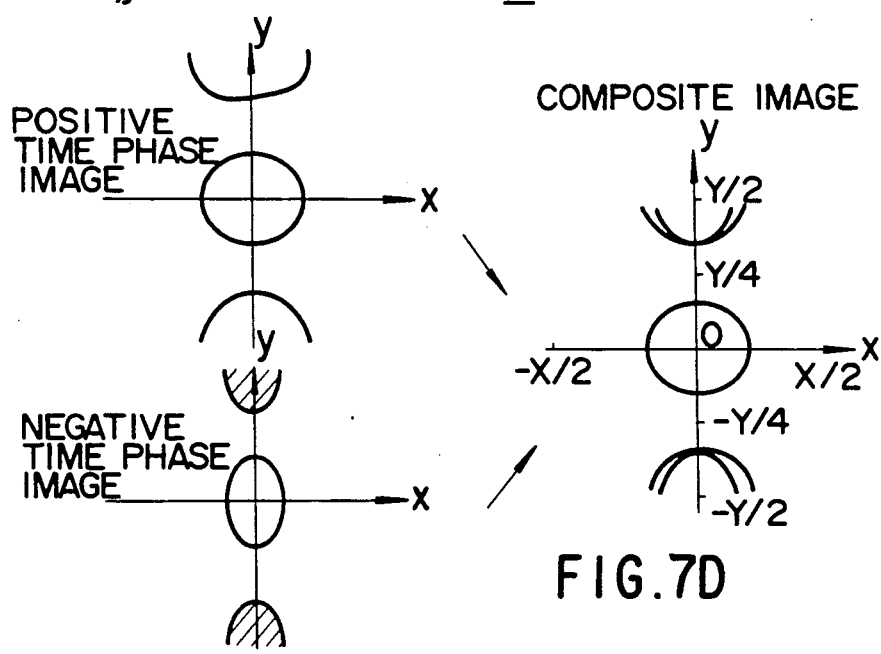

FIG. 4 shows the flow of data processing in this system. Note that these operations may be performed in a computer in a software manner or may be performed in a hardware manner by arranging processing circuits and the like.

Measurement of a static field inhomogeneity (step 21), measurement of spatial nonlinearity of a gradient field (step 22), and measurement of temporal variation of gradient field (step 23) are performed. Methods of measuring a static field inhomogeneity $\Delta H(x,y)$ (including a static field offset and the like) in a slice portion have been proposed by, e.g., Maudsley. For example, in the measurement method by Maudsley, the following sequence is employed. A slice plane is selectively excited by a slicing gradient field and a 90° selective excitation RF pulse. Gradient fields in two orthogonal directions within the slice plane are then applied to the slice portion. In addition, a 180° pulse is applied to generate spin echoes. This sequence is repeated while the gradient fields in the two directions are gradually changed. The field distribution in the slice plane is measured by measuring the spin echoes in the repeated sequences. This measurement of static field inhomogeneity may be performed for every imaging or may be performed once (if changes over time are small) so as to use the measurement result for every imaging. Similar to static field inhomogeneity, spatial nonlinearity of a gradient field causes positional errors and density changes in a reconstructed image. For example, the nonlinearity of the gradient field can be measured by a method in which a gauss meter for measuring a static field is used while a constant current is supplied to a gradient coil. Temporal variation of gradient field are determined by the switching characteristics of a gradient coil, the time characteristics of an antimagnetic field due to an eddy current, and the like, and cause blurring in a reconstructed image. For example, the temporal variation of gradient field can be measured by integrating an induced current generated in a pickup coil while switching of the gradient field is performed. The gradient field nonlinearity and the temporal variation of gradient field do not exhibit much variation over time in the same apparatus. Therefore, if these factors are measured beforehand, a satisfactory effect can be obtained by only using the measurement results for every imaging.

Subsequently, data acquisition of an echo signal train S(t) is performed by a predetermined pulse sequence shown in FIGS. 1A–1D or 2A–2D (step 24). The echo signal train S(t) is separated into an echo signal train Sp(t) which is acquired when the read gradient field Gr is at positive time phases and an echo signal train Sn(t) which is acquired when the read gradient field Gr is at negative time phases (step 25). The echo signal trains Sp(t) and Sn(t) are functions on a Fourier space of a density distribution. In step 25, the data are rearranged on this Fourier space in order to match the data with subsequent data processing.

Image reconstruction process with respect to the echo signal trains Sp(t) and Sn(t) are respectively performed to reconstruct positive and negative time phase images (step 26 and 27). A Fourier transform method is used as an image reconstruction method in this case. However, if significant noise exists in an echo signal train, a maximum entropy method or the like may be used.

Positive correction (steps 28 and 29), density correction (steps 30 and 31), and blurring correction (steps 32 and 33) are performed with respect to the positive and negative time phase images obtained in steps 26 and 27, respectively. The positive correction (steps 28 and 29) and the density correction (steps 30 and 31) are corrections with respect to the inhomogeneity of the static field (including the static field offset and the detection frequency deviation), the spatial nonlinearity of the gradient field, the water/fat mixture system, and the inclined data sampling in the Fourier space of the density distribution, which are obtained in steps 21 and 22. The blurring correction (steps 32 and 33) is a correction with respect to the temporal variation of gradient field which are obtained in step 23.

Finally, the corrected positive and negative time phase images are added and synthesized in the same imaging region (step 34), and the result is displayed on the display (step 35).

The above-described data processing method is very effective when the following factors are present at a significant level: a static field inhomogeneity, a static field offset, a water/fat mixture system, detection frequency deviation, inclined data sampling in a Fourier space of a density distribution, spatial nonlinearity of gradient fields, temporal variation of gradient fields, and the like. It is apparent, however, that if such incompleteness of the system and the method can be neglected, a normal data processing method in which positive and negative time phase echo signal trains are not separated can be satisfactorily employed.

A method of correcting image artifacts and the like on the basis of the ultra high speed Fourier method according to the present invention will be described in detail below.

In the pulse sequence of the ultra high speed Fourier method shown in FIGS. 2A–2D, an echo signal train $\tilde{S}(t)$ which is observed when the static field inhomogeneity $\Delta H(x,y)$ is present in given by the following equation:

$$\tilde{S}(t) = S_o \exp(-t/T_2) \int\int \rho(x,y)\exp[-j2\pi\gamma(\Delta H(x,y)\cdot t + \Psi_x(t,x) + \Psi_y(t,y))]dxdy \quad (1)$$

where t=0 is the time when phases of magnetization in a slice plane are accurately matched with each other, $T_2$ is the transverse magnetization relaxation time, $\rho(x,y)$ is the spin density distribution of an object to be examined, Y is the nuclear gyromagnetic ratio, $\Psi_x(t,x)$ is the phase of magnetization which is based on a read-out gradient field and dependent on time t and a coordinate value x, and $\Psi_y(t,y)$ is the phase of magnetization which is based on a phase encoding gradient field and dependent on time t and a coordinate value y. The phases $\Psi_x(t,x)$ and $\Psi_y(t,y)$ are respectively given by the following equations:

$$\Psi_x(t,x) = \int g_x(x)\phi_x(t)dx \quad (2)$$

$$\Psi_y(t,y) = \int g_y(y)\phi_y(t)dy \quad (3)$$

where $g_x(x)$ and $g_y(y)$ are functions respectively representing spatial distributions of the read-out gradient field and the phase encoding gradient field, and can be represented as follows:

$$g_x(x) = G_x x + \tilde{g}_x(x) \quad (4)$$

$$g_y(y) = G_y y + \tilde{g}_y(y) \quad (5)$$

where $G_x x$ and $G_y y$ are linear components of the respective gradient fields, and g(x) and g(y) are nonlinear components thereof.

Assume that the respective gradient fields have linear distributions and a switching operation is performed in accordance with the pulse sequence in FIGS. 2A–2D. $\Psi_x(t,x)$ and $\Psi_y(t,y)$ of echo signals immediately after the ith switching operation of the read-out gradient field are respectively given by the following equations:

$$\Psi_x(t,x) = (-1)^i G_x X(t-i\tilde{T}_r) \quad (6)$$

$$\Psi_y(t,y) = iG_y y\Delta t_y \quad (7)$$

where i is a positive or negative integer, and an echo signal having the center at t=0 is set to be the zeroth echo signal. In addition, $\tilde{T}_r$ is a switching interval of the read gradient field, and $\Delta t_y$ is a pulse application time width of the phase encoding gradient field. Therefore, an ith echo signal $\tilde{S}_i(t)$ can be represented as follows:

$$\tilde{S}_i(t) = S_o \text{ext}(-t/T_2)\int\int \rho(x,y)\exp[-j2\pi\gamma(\Delta H(x,y)\cdot t + \quad (8)$$

$$(-1)^i G_x x(t - i\tilde{T}_r) + iG_y y\Delta t_y)]dxdy$$

In this case, $(k_x, k_y)$ as spatial frequency coordinates in the Fourier space of the spin density distribution of the object are defined as follows:

$$k_x = 2\pi Y G_x(t-i\tilde{T}_r) \quad (9)$$

$$k_y = 2\pi Y G_y i\Delta t_y = 2\pi Y \tilde{G}_y i\tilde{T}_r \quad (10)$$

where Gy is the equivalent gradient field strength when a phase encoding gradient field pulse is applied in a time $\tilde{T}_r$ in the ultra high speed Fourier method. If equation (8) is rewritten by using equations (9) and (10), $S_i(t)$ is given as a function $S(k_x,k_y)$ on the Fourier space as follows:

$$\tilde{S}(k_x,k_y) = \int\int \rho(x,y)\exp[-j(k_x((-1)^i x + \Delta H(x,y)/G_x) + \quad (11)$$

$$k_y(y + \Delta H(x,y)/\tilde{G}_y))]dxdy$$

In this case, since $T_2$ is sufficiently larger than t, transverse relaxation term of equation (8) is omitted. As shown in FIG. 5, in the ultra high speed Fourier method, acquired data draws a zigzag locus on ideal lattice points of the Fourier space toward $k_y$. As described above, $\tilde{S}(k_x,k_y)$ is acquired in step 24 (data acquisition). A case wherein the present invention is applied to the ultra high speed Fourier method will be described in detail below in accordance with the flow of data processing shown in FIG. 4.

(1) Step 25 (separation and rearrangement of positive and negative time phase data):

Of the echo signal trains $\tilde{S}(k_x,k_y)$ an echo signal train which is acquired when a read-out gradient field is at positive time phases is represented by $Sp(k_x,k_y)$ and an echo signal train which is acquired when a read gradient field is at negative time phases is represented by $S_n(k_x,k_y)$. These echo signals can be represented by the following equations $$\tilde{S}p(k_x,k_y) = \int\int \rho(x,y)\exp[-j(k_x(x + \Delta H(x,y)/G_x) + k_y(y + \Delta H(x,y)/\tilde{G}_y))]dxdy \quad (12)$$

$$\tilde{S}_n(k_x,k_y) = \int\int \rho(x,y)\exp[-j(k_x(x - \Delta H(x,y)/G_x) + k_y(y + \Delta H(x,y)/\tilde{G}_y))]dxdy \quad (13)$$

where $\tilde{S}_n(k_x,k_y)$ is an echo train obtained by inverting and rearranging $k_x$ with respect to the echo signal train when the read-out gradient field is at negative time phases. $\tilde{S}_n(k_x,k_y)$ can be expressed as discrete data on the Fourier space $(k_x,k_y)$ as follows:

$$\tilde{S}(k_x, k_y) = \tilde{S}p(k_x, k_y) \sum_{m=-N_e/4}^{N_e/4} \delta(k_y - 2m\Delta k_y) \sum_{l=-N_r/2}^{N_r/2} \delta(k_x - l\Delta k_x) + \tilde{S}_n(k_x, k_y) \sum_{m=-N_e/4}^{(N_e/4)-1} \delta(k_y - (2m+1)\Delta k_y) \sum_{l=-N_r/2}^{N_r/2} \delta(k_x - l\Delta k_x) \quad (14)$$

where $N_r$ and $N_e$ are the number of data in the read-out direction and the number of data in the phase encoding direction, respectively, and $\Delta k_x$ and $\Delta k_y$ are the sampling pitches in the read-out and phase encoding directions of the Fourier space. As is apparent from equations (12) and (13), $\tilde{S}p(k_x,k_y)$ and $\tilde{S}_n(k_x,k_y)$ become different functions when the static field inhomogeneity exists, and hence mismatching occurs between the two signal trains constituting the echo signal train $\tilde{S}(k_x,k_y)$. FIG. 6B shows such a state. (2) Steps 26 and 27 (image reconstruction based on positive and negative time phase data):

Data obtained by performing Fourier transform of the discrete data represented by equation (14) is given as $\tilde{\rho}(x,y)$ by the following equation:

$$\tilde{\rho}(x,y) = \tilde{\rho}_p(x,y)/2 * R_p(y) * R(x) + \tilde{\rho}_n(x,y)/2 * R_n(y) * R(x) \quad (15)$$

where * represents convolution integral, $\tilde{\rho}_p(x,y)$ and $\tilde{\rho}_n(x,y)$ are functions obtained by performing Fourier transform of $Sp(k_x,k_y)$ and $S_n(k_x,k_y)$, R(x) is a function which gives repetition of a period $X(=2\pi/\Delta k_x)$ in the x direction, $R_n(y)$ is a function which gives repetition of a period $Y/2(=\pi/\Delta k_y)$ in the y direction, and $R_n(y)$ is a function having positive/negative repetition of a period Y/2 in the y direction. Note that X and Y represent imaging ranges in the x and y directions, respectively. The first and second terms of the right-hand side of equation (15) respectively correspond to images reconstructed from positive and negative time phase data of a read-out gradient field. Each image has a period X in the x direction and a period Y/2 in the y direction. Coordinate transformation of equations (12) and (13) is performed according to the following equations:

$$x' = x + \Delta H(x,y)/G_x \quad (16)$$

$$y' = y + \Delta H(x,y)/\tilde{G}_y \quad (17)$$

$$x'' = x = \Delta H(x,y)/G_x \quad (18)$$

$$y'' = y + \Delta H(x,y)/\tilde{G}y \quad (19)$$

In this case, equations (12) and (13) can be expressed as follows:

$$\tilde{S}p(k_x,k_y) = \int\int \rho'(x',y')\exp[-j(k_xx' + k_yy')]dx'dy' \quad (20)$$

$$\tilde{S}n(k_x,k_y) = \int\int \rho''(x'',y'')\exp[-j(k_xx'' + k_yy'')]dx''dy'' \quad (21)$$

In this case, $$\tilde{\rho}_p(x',y') = \rho'(x',y') = \rho(x,y)/J_p(x,y)J_p(x,y) = 1 + (1/G_x)(a/a_x)\Delta H(x,y) \quad (22)$$

$$J_p(x,y) = 1 + (1/G_x)(\partial/\partial x)\Delta H(x,y) + (1/\tilde{G}_y)(\partial/\partial y)\Delta H(x,y) \quad (23)$$

$$\tilde{\rho}_n(x'',y'') = \rho''(x'',y'') = \rho(x,y)/J_n x,y)J_n(x,y) = 1 - (1/G_x)(a/a_x)\Delta H(x,y) \quad (24)$$

$$J_n(x,y) = 1 - (1/G_x)(\partial/\partial x)\Delta H(x,y) + (1/\tilde{G}_y)(\partial/\partial y)\Delta H(x,y) \quad (25)$$

As is apparent from equations (16) to (25), the positive time phase image is an image which has a distribution $\tilde{\rho}_p(k',y')$ which underwent the density change represented by equation (22) and positional changes represented by equations (16) and (17) with respect to the true spin density distribution $\rho(x,y)$, and which is repeated at the periods X and Y/2 in the x and y directions, respectively. The negative time phase image is an image which has a distribution $\tilde{\rho}_n(x'',y'')$ which underwent the density change represented by equation (24) and the positional changes represented by equations (18) and (19) with respect to $\rho(x,y)$, and which is repeated at the period X in the x direction and is positively and negatively repeated at the period Y/2 in the y direction. Each of FIGS. 7A to 7H shows a case wherein an image is reconstructed without performing any correction of positive and negative time phase images. In FIGS. 7A to 7H, negative image portions based on negative time phase data are hatched. Note that since the same positional changes in the y direction occur in positive and negative time phase images in FIGS. 7A to 7H, a case wherein the center of $\rho(x,y)$ is located on y=0 is exemplified. In addition, distortion of $\rho(x,y)$ in the y direction is not shown. As is apparent from equations (16) and (18), positional errors and distortion in the x direction appear differently in positive and negative time phase images and they change in different manners depending on the static field inhomogeneity $\Delta H(x,y)$. FIGS. 7A–7B, 7C–7D, 7E–7F, and 7G–7H respectively show reconstructed images when $\Delta H(x,y)$ is an even function of x, an odd function of x, an even function of x, and an odd function of y. In each case, conspicuous artifacts appear at positions which are shifted from a true density distribution by ±Y/2 in the y direction. If ΔH(x,y) is a composite function of these functions, the obtained image is a combination of the images in FIGS. 7A to 7H. (3) Steps 28 and 29 (position correction of positive and negative time phase images); steps 30 and 31 (density correction of positive and negative time phase images):

FIGS. 8A–8F explain a method of correcting a positive time phase image $\bar{\rho}_p(x',y')$, as seen in FIGS. 8A–8B, and a negative time phase image $\bar{\rho}_n(x'',y'')$ as seen in FIGS. 8C–8D. Similarly, negative image portions based on negative time phase data are hatched. An image which does not have the above-described artifacts and is free from positional errors and distortion based on phase encoding errors can be obtained by performing the following position correction and density correction for the images $\bar{\rho}_p(x',y')$ and $\bar{\rho}_n(x'',y'')$. Note that data which is measured beforehand is used as the static field inhomogeneity ΔH(x,y) when a correction processing is performed.

(Correction of positive time phase image)

$$x = x' - \Delta H'(x',y')/G_x \quad (26)$$

$$y = y' - \Delta H'(x',y')/\tilde{G}_y \quad (27)$$

$$\rho(x,y) = \rho_p(x',y')J_p'(x',y') \quad (28)$$

(Correction of negative time phase image)

$$x = x' + \Delta H''(x'',y'')/G_x \quad (29)$$

$$y = y' - \Delta H''(x'',y'')/\tilde{G}_y \quad (30)$$

$$\rho(x,y) = \rho_n(x'',y'')J_n''(x'',y'') \quad (31)$$

where ΔH'(x',y') and $J_p'(x',y')$ respectively correspond to ΔH(x,y) and $J_p(x,y)$ represented by an (x',y') coordinates system, and ΔH''(x'',y'') and $J''_n(x'',y'')$ respectively correspond to ΔH(x,y) and $J_n(x,y)$ represented by an (x'',y'') coordinate system. If the positive and negative time phase images after correction are added to each other and synthesized on the basis of the (x,y) coordinate system, a true density distribution ρ(x,y) is obtained. If the range of ρ(x,y) in the y direction is wider than ½ a imaging range Y, aliasing appears in the positive and negative time phase images. In this case, the correction processing represented by equations (26) to (31) may not be directly performed. If ΔH(x,y) can be expressed by only using a function of x, correction can be performed regardless of aliasing. However, if a function of y is used, correction cannot be uniquely performed in areas where aliasing appears. In such a case, correction can be performed by, e.g., the following methods.

According to the first method, proper data interpolation is performed with respect to data which is obtained when a read gradient field is at positive time phases and to data which is obtained when the read-out gradient field is at negative time phases in order to reduce an apparent sampling pitch in a ky direction of a Fourier space (kx,ky). This prevents aliasing in positive and negative time phase images, and hence allows the above-described correction processing. In practice, data interpolation may be performed by, e.g., performing interpolation with respect to positive and negative time phase data using sync functions. If the S/N ratio of an image is decreased due to the above-described interpolation, the maximum entropy method may be used as an image reconstruction method in place of the Fourier transform method.

According to the second method, image reconstruction is performed by using data acquired by two scan operations. In this method, the first scan operation is performed in accordance with the pulse sequence in FIGS. 2A–2D, and the second scan operation is performed in accordance with a pulse sequence in which the read-out gradient field Gr is inverted. The data acquired by the two scan operations is separated into data which is acquired when the read gradient field Gr is at positive time phases and data which is acquired when the read-out gradient field Gr is at negative time phases. The separated data are then rearranged on the Fourier space. In this case, since the sampling pitch of each time phase data is reduced to ½ that of data obtained by one scan operation, both the positive and negative time phase images include no aliasing. Therefore, position and density correction of both the images can be performed regardless of spatial dependency of static field inhomogeneity. By adding and synthesizing the images after correction, an image which has a higher S/N ratio than that of an image obtained by one scan operation and has no artifacts can be obtained. This method is especially effective for a head portion where movement can be neglected. This method is also applicable to a cardiovascular system and the like in combination with an electrocardiogram synchronization technique in which MR data is acquired in synchronism with a specific time phase of an electrocardiogram signal.

The methods of correcting image artifacts and the like which are present when static field inhomogeneity is present have been described above. Methods of correcting image artifacts and the like when a static field offset, detection frequency deviation, and the like are present and when atomic nuclei having different NMR frequencies, e.g., atomic nuclei contained in water and fat are present will be described below.

A reconstructed image $\bar{\rho}(x,y)$ which is obtained by Fourier transform of positive and negative time phase echo data without separation processing when a static field offset and detection frequency deviation are present or a water/fat mixture system is present can be expressed as follows:

$$\bar{\rho}(x,y) = (1/2)\rho(x - (D/G_x), y - (D/G_y))*R_p(y)*R(x) + \quad (32)$$

$$(1/2)\rho(x + (D/G_x), y - (D/\tilde{G}_y))*R_n(y)(R(x)$$

where D corresponds to a static field offset, detection frequency deviation, or a difference in center frequency between MR signals obtained from water and fat. Other factors are the same as those described above. When a detection frequency is to be matched with the center frequency of the MR signal from water in a water/fat mixture system, equation (32) represents a reconstructed image of fat. The first and second terms of equation (32) respectively correspond to the positive and negative time phase images. $\bar{\rho}(x,y)$ is an image which has ρ(x,y) shifted by D/Gy in the y direction and artifacts each having a width of 2D/Gx appeared at positions from the center of ρ(x,y) by ±Y/2 in the y direction.

In practice, correction is performed by adding and synthesizing, within the same imaging region, an image which is shifted from the positive time phase image by $-D/G_x$ and $-D/G_y$ in the x and Y directions, respectively, and an image which is shifted from the negative time phase image by $D/G_x$ and $-D/G_y$ in the x and y directions, respectively. As is apparent from equation (32), since changes in position of the respective images are constant regardless of the values of x and y, the above-described correction can be performed even if aliasing appears in the respective images.

The correction methods based on the ultra high speed Fourier method shown in FIGS. 2A-2D have been described above. However, substantially the same correction processing can be performed even by using the echo planar method shown in FIGS. 1A-1D. In contrast to the ultra high speed Fourier method, in the echo planar method, image artifacts unique to a scan scheme are produced in addition to image artifacts based on static field inhomogeneity because of inclination of a data acquisition scheme in the Fourier space $(k_x, k_y)$. In the methods of correcting positive and negative time phase images when static field inhomogeneity is present, correction processing may be performed by replacing $\Delta H(x,y)$ with $\Delta H(x,y) + G_y y$.

What is claimed is:

1. An MRI system for applying a phase encoding gradient field, a read-out gradient field, and an RF field to an object to be examined which is placed in a homogeneous static field in accordance with a predetermined pulse sequence so as to excite MR at a specific slice plane of the object, thereby detecting an MR signal from the object and visualizing the slice plane, comprising:

data acquiring means for acquiring all the data required for image reconstruction of the slice plane excited by the RF field within a time in which magnetization in the slice plane is relaxed due to a transverse magnetization relaxation phenomenon by switching the read-out gradient field to positive and negative phases by applying the phase encoding gradient field as a plurality of pulses during the read-out gradient field switching;

image reconstructing means, for obtaining positive and negative time phase images, comprising means for separating all acquired data into separated data including data which is acquired when the read-out gradient field is at positive time phases and data which is acquired when the read gradient field is at negative time phases, for rearranging the separated data in a Fourier space of an MR density distribution at the slice plane of the object, and for subsequently performing Fourier transform of the respective data;

correcting means comprising means for independently correcting image degradation factors with respect to the positive and negative time phase images obtained from said correcting means; and image synthesizing means for obtaining an MR image of the slice portion by synthesizing both time phase images corrected by said correcting means.

2. A system according to claim 1, wherein said image synthesizing means comprises means for adding and synthesizing the two images, which are corrected by said correcting means, in the same imaging region.

3. An MRI system comprising:

static field applying means for applying a homogeneous static field to an object to be examined;

MR exciting means for applying a phase encoding gradient field, a read-out gradient field, and an RF field to the object in accordance with a predetermined pulse sequence so as to excite MR at a specific slice plane of the object; and signal receiving/processing means for detecting an MR signal from the object and visualizing the slice plane;

said MR exciting means including data acquiring means for acquiring all the data required for image reconstruction of the slice plane excited by the RF field within a time in which magnetization in the slice plane is relaxed due to a transverse magnetization relaxation phenomenon by switching the read-out gradient field to positive and negative polarities by applying the phase encoding gradient field in the form of a plurality of pulses during the read-out gradient field switching;

said signal receiving/processing means including image reconstruction means, for obtaining positive and negative time phase images, including image reconstructing means comprises means for separating all acquired data into separated data including data which is acquired when the read-out gradient field is at positive time phases and data which is acquired when the read-out gradient field is at negative time phases, for rearranging the separated data in a Fourier space of an MR density distribution at the slice plane of the object, and for subsequently performing Fourier transform of the respective data;

correcting means comprising means for independently correcting image degradation factors with respect to the positive and negative time phase images obtained by said reconstructing means; and image synthesizing means for obtaining an MR image of the slice portion by synthesizing both time phase images corrected by said correcting means.

4. A system according to claim 3, wherein the predetermined pulse sequence in said MR exciting means includes a sequence based on a high-speed Fourier method.

5. A system according to claim 4, wherein said image reconstructing means comprises means for separating all acquired data into data which is acquired when the read-out gradient field is at positive time phases and data which is acquired when the read-out gradient field is at negative time phases, rearranging the separated data in a Fourier space of an MR density distribution at the slice plane of the object, and subsequently performing Fourier transform of the respective data.

6. A system according to claim 4, wherein said correcting means comprises means for independently correcting the image degradation factors with respect to the pair of images obtained by said image reconstructing means.

7. A system according to claim 6, wherein the image degradation factor includes at least one of a positional error and a density change of an image due to a static field inhomogeneity, a positional error of an image due to a static field offset, a positional error of an image when atomic nuclei, such as ones contained in water and fat, having different MR frequencies are present, a positional error of an image when a detecting frequency is different from a center frequency of a received MR signal, image distortion due to inclination of a data sampling scheme in a Fourier space of a density distribution of an object to be examined, and a positional error, a density change, and blurring of an image due to spatial nonlinearity of a gradient field and temporal variation of gradient field.

8. A system according to claim 4, wherein said image synthesizing means comprises means for adding and synthesizing the two images, which are corrected by said correcting means, in the same imaging region.

* * * * *